US011829079B2

(12) United States Patent
Terao

(10) Patent No.: US 11,829,079 B2
(45) Date of Patent: Nov. 28, 2023

(54) POSITIONING APPARATUS, LITHOGRAPHY APPARATUS AND ARTICLE MANUFACTURING METHOD

(71) Applicant: CANON KABUSHIKI KAISHA, Tokyo (JP)

(72) Inventor: Tsutomu Terao, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 218 days.

(21) Appl. No.: 17/492,987

(22) Filed: Oct. 4, 2021

(65) Prior Publication Data

US 2022/0107572 A1    Apr. 7, 2022

(30) Foreign Application Priority Data

Oct. 7, 2020    (JP) ................................. 2020-170031

(51) Int. Cl.
*G03F 7/00* (2006.01)
*H01L 21/027* (2006.01)
*G03F 7/20* (2006.01)

(52) U.S. Cl.
CPC ........ *G03F 7/70775* (2013.01); *H01L 21/027* (2013.01); *G03F 7/20* (2013.01)

(58) Field of Classification Search
CPC .... G03F 7/70775; G03F 7/20; G03F 7/70758; G03F 7/70725; G03F 7/70716; H01L 21/027
See application file for complete search history.

(56) References Cited

U.S. PATENT DOCUMENTS

| 6,408,045 B1 * | 6/2002 | Matsui .................... G03F 7/709 378/204 |
| 6,852,989 B2 * | 2/2005 | Kwan ................. G03F 7/70716 269/73 |
| 9,977,347 B2 * | 5/2018 | Suzuki ............... G03F 7/70758 |

FOREIGN PATENT DOCUMENTS

| JP | H06163359 A | 6/1994 |
| JP | H08314517 A | 11/1996 |

\* cited by examiner

*Primary Examiner* — Hung V Nguyen
(74) *Attorney, Agent, or Firm* — ROSSI, KIMMS & McDOWELL LLP

(57) ABSTRACT

The present invention provides a positioning apparatus for positioning of an object, the positioning apparatus including a first actuator and a second actuator configured to be arranged along a first direction so as to be parallel to each other, and to cause a beam to move in the first direction, a third actuator configured to be built in the beam, and to cause the object to move in a second direction relative to the beam, the second direction intersecting with the first direction, and a control unit configured to control the first actuator, the second actuator, and the third actuator.

24 Claims, 9 Drawing Sheets

United States Patent US 11,829,079 B2

POSITIONING APPARATUS, LITHOGRAPHY APPARATUS AND ARTICLE MANUFACTURING METHOD

BACKGROUND OF THE INVENTION

Field of the Invention

The present invention relates to a positioning apparatus, a lithography apparatus and an article manufacturing method.

Description of the Related Art

Along with the rapid progress in high integration of semiconductor elements in recent years, higher positioning accuracy is demanded in lithography apparatuses, such as exposure apparatuses, that are used in manufacturing of semiconductor elements. Also, in lithography apparatuses, highly accurate positioning needs to be done at higher speed to improve throughput.

Japanese Patent Laid-Open No. 6-163359 and Japanese Patent Laid-Open No. 8-314517 propose techniques related to positioning apparatuses that are favorable for such lithography apparatuses. Japanese Patent Laid-Open No. 6-163359 discloses a positioning apparatus called an H-shaped stage apparatus, which is configured in such a manner that an X beam including an X actuator built therein is connected to (extends horizontally relative to) two Y actuators that are parallel to each other. In this positioning apparatus, yawing vibration attributed to a movement in the X direction and the Y direction is suppressed by performing feedback control, in which the distribution ratio between the two Y actuators is calculated in real time by measuring the rotation displacement around the center of mass, which is attributed to a position in the X direction.

Furthermore, Japanese Patent Laid-Open No. 8-314517 discloses a technique that, in order to suppress inter-axis interference and a disturbance that depend on the position and orientation of a stage, switches among inter-axis decoupling instructions to be applied depending on the position and speed. This technique suppresses vibration of an XY stage, as well as a θz stage (rotation stage) on the XY stage, relative to a moment that is generated by a movement in the X direction or a movement in the Y direction.

During a movement of an object, a moment is generated in the direction that is different from the direction of the movement due to a displacement between the center of mass of the object and the effort. Therefore, in a highly accurate positioning apparatus, a moment generated by a movement of an object is suppressed by making the center of mass of the object and the effort coincide with each other. However, due to a weight reduction, restrictions on arrangement, manufacturing tolerance, and the like, it is not possible to make the center of mass of the object and the effort coincide with each other in a strict sense. As a result, vibration is transmitted not only to the main axis of the movement, but also to other axes that are not involved in the movement.

The techniques disclosed in Japanese Patent Laid-Open No. 6-163359 and Japanese Patent Laid-Open No. 8-314517 are effective in suppressing vibration caused by such interference with other axes. However, with the technique disclosed in Japanese Patent Laid-Open No. 6-163359, yawing vibration of the X beam is detected using a sensor, and this vibration is suppressed through feedback control; this causes a delay in response. Also, the technique disclosed in Japanese Patent Laid-Open No. 8-314517 can suppress vibration of the θz stage, but cannot suppress yawing vibration of the X beam that connects between the two Y actuators. Especially, in recent years, the accuracy and throughput have been improved in lithography apparatuses, such as exposure apparatuses, and thus the influence of yawing vibration of the X beam has become apparent as the apparatus performance.

SUMMARY OF THE INVENTION

The present invention provides a positioning apparatus that is advantageous in realizing highly accurate positioning.

According to one aspect of the present invention, there is provided a positioning apparatus for positioning of an object, the positioning apparatus including a first actuator and a second actuator configured to be arranged along a first direction so as to be parallel to each other, and to cause a beam to move in the first direction, a third actuator configured to be built in the beam, and to cause the object to move in a second direction relative to the beam, the second direction intersecting with the first direction, and a control unit configured to control the first actuator, the second actuator, and the third actuator, wherein the control unit obtains, from a first operation amount to be applied to the third actuator so as to move the object to a first target position in the second direction, different first correction operation amounts to be applied respectively to the first actuator and the second actuator so as to reduce rotation that occurs in the beam due to the movement of the object to the first target position, applies the first operation amount to the third actuator, applies the different first correction operation amounts respectively to the first actuator and the second actuator, and performs feedforward control with respect to the first actuator and the second actuator.

Further aspects of the present invention will become apparent from the following description of exemplary embodiments with reference to the attached drawings.

DESCRIPTION OF THE EMBODIMENTS

Figure 1:
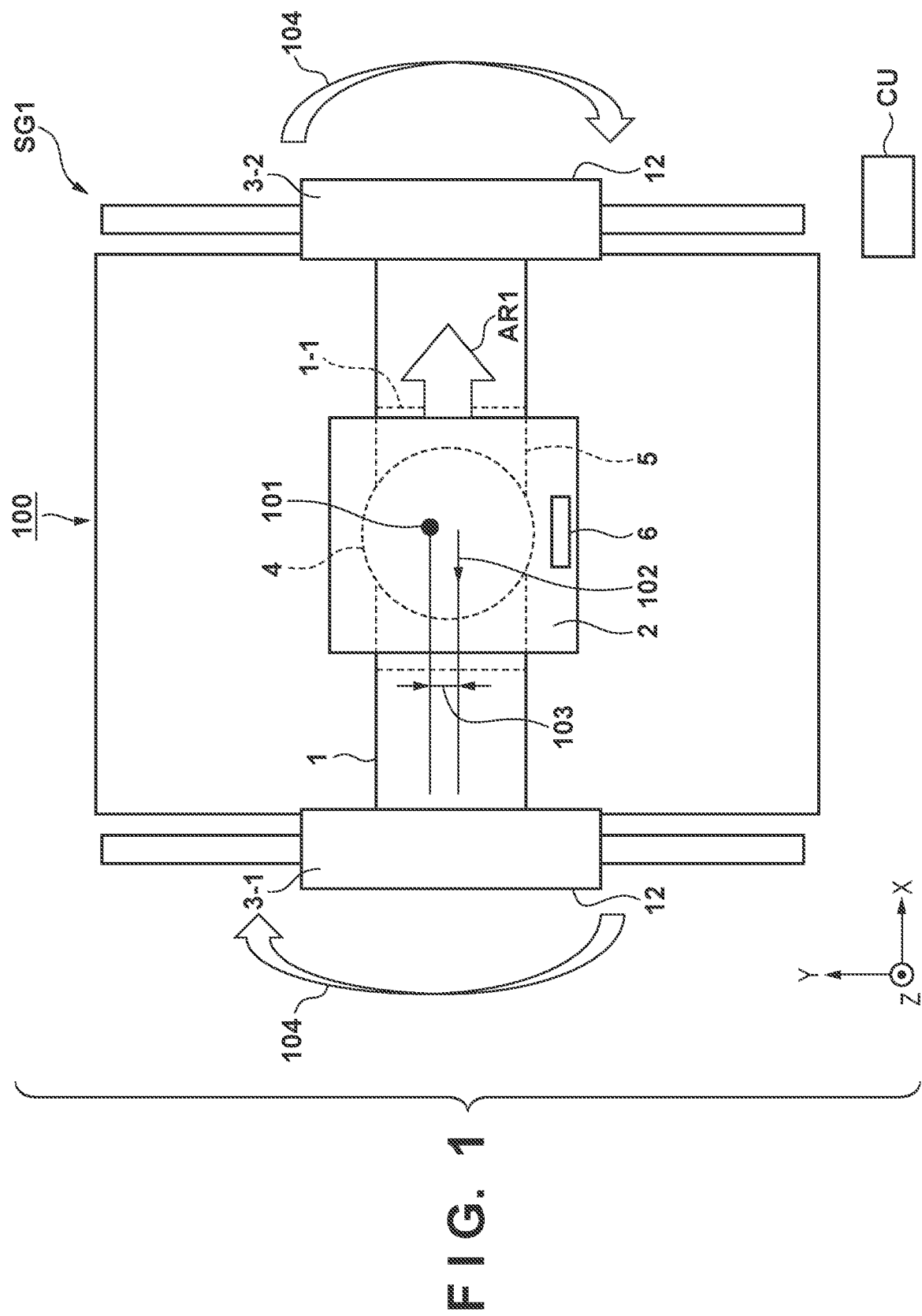
FIG. 1 is a schematic diagram showing a configuration of a positioning apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 2:
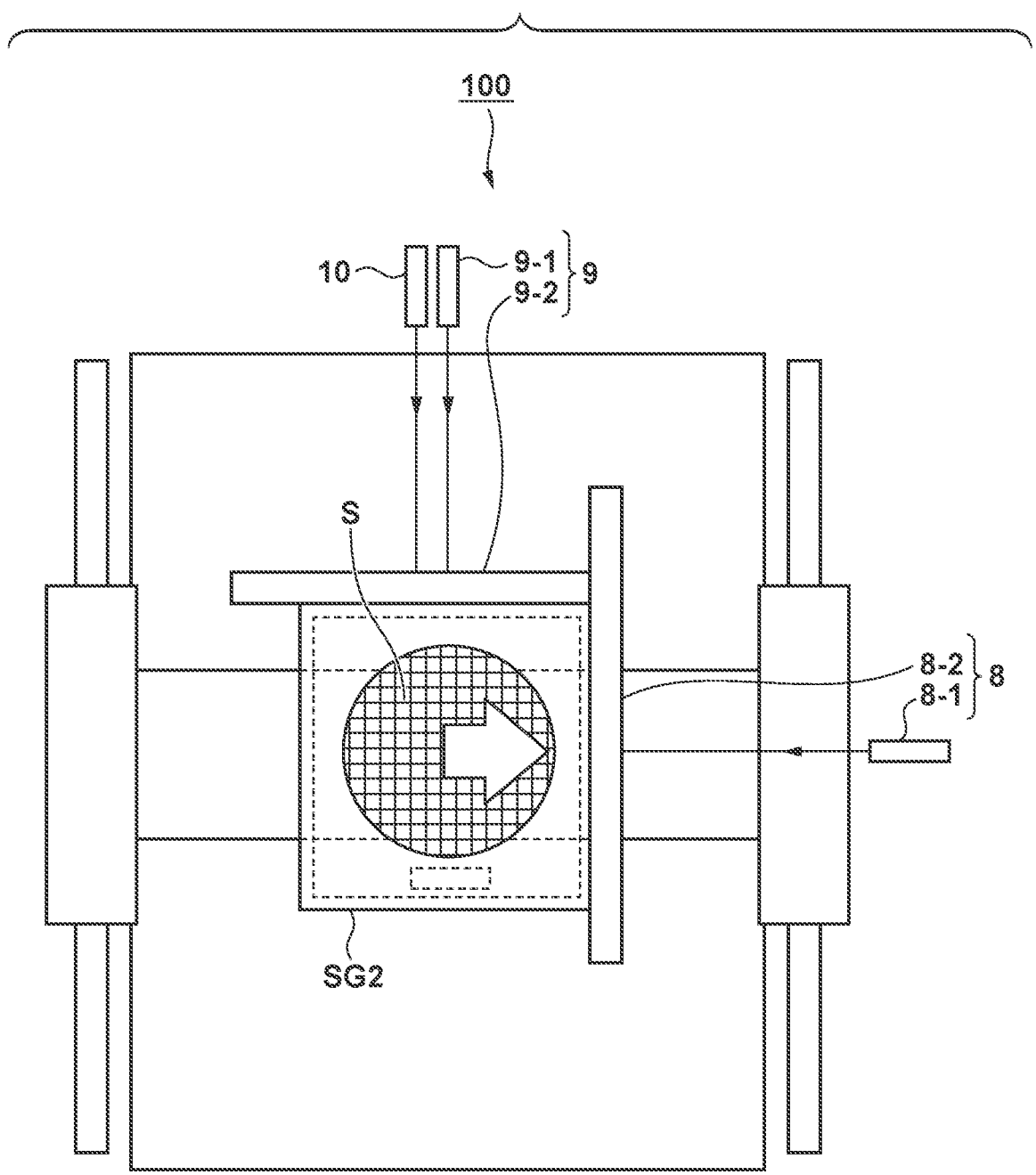
FIG. 2 is a schematic diagram showing the configuration of the positioning apparatus as one aspect of the present invention.

FIG. 1 and FIG. 2 are schematic diagrams showing a configuration of a positioning apparatus 100 as one aspect of the present invention. FIG. 1 is a diagram for describing a first stage SG1 that composes the positioning apparatus 100, and FIG. 2 is a diagram for describing a second stage SG2 that composes the positioning apparatus 100. The positioning apparatus 100 has a function of positioning an object, and is embodied as a stage apparatus in which an XY actuator is arranged in the shape of H, or a so-called H-shaped stage apparatus, as shown in FIG. 1. The positioning apparatus 100 is favorable as, for example, a positioning apparatus that positions a substrate S in an exposure apparatus that exposes the substrate S to light. In the present embodiment, a direction that is parallel to an X beam 1 is an X direction (a second direction that intersects with a first direction), and a direction that is perpendicular to the X beam 1 is a Y axis.

A YL actuator 3-1 (first actuator) and a YR actuator 3-2 (second actuator) are arranged along a Y direction (first direction) so as to be parallel to each other. The YL actuator 3-1 and the YR actuator 3-2 are actuators for moving the X beam 1 in the Y direction.

The X beam 1 includes an X actuator 1-1 (third actuator) built therein, and is connected to the YL actuator 3-1 and the YR actuator 3-2 while stretching (extending horizontally) therebetween. In other words, the two actuators, namely the YL actuator 3-1 and the YR actuator 3-2 are arranged at both sides of the X beam 1 so as to be perpendicular to the X beam 1. Also, an X slide air guide 5 is provided so that an X slider 2 (object) is movable along the X beam 1 while avoiding contact with the X beam 1. The X actuator 1-1 is an actuator for moving the X slider 2 in the X direction (the second direction that intersects with the first direction) relative to the X beam 1.

As shown in FIG. 2, the second stage SG2 (object) that holds the substrate S is mounted, in a contactless manner, on the first stage SG1. The second stage SG2 is a stage that is movable, on the first stage SG1, in a Z direction, a tilt direction, and a rotary direction within a gap of a radial air guide 4. In this way, the positioning apparatus 100 is configured to be movable along the six axes in the X direction, Y direction, Z direction, θx direction, θy direction, and θz direction.

The second stage SG2 is provided with an X bar mirror 8-2 and a Y bar mirror 9-2. Also, an X laser interferometer 8-1 is provided with respect to the X bar mirror 8-2, and a Y laser interferometer 9-1 and a Y-Yaw interferometer 10 are provided with respect to the Y bar mirror 9-2. In this way, the position in the X direction, the position in the Y direction, and the rotation θz around the Z axis can be measured in connection with the second stage SG2. Furthermore, an X pitch laser interferometer (not shown), which is arranged at a position different from the position of the X laser interferometer 8-1 in the Z direction, measures the rotation θy around the Y axis in connection with the second stage SG2. Similarly, a Y pitch laser interferometer (not shown), which is arranged at a position different from the position of the Y laser interferometer 9-1 in the Z direction, measures the rotation θy around the X axis in connection with the second stage SG2. Moreover, three Z encoders are provided that measure, from the second stage SG2, the position and the tilt in the Z direction in connection with the first stage SG1.

In the present embodiment, the second stage SG2 is rotated around the Z axis (θz driving is performed) from the first stage SG1 via a θz motor 6 (fourth actuator). The θz motor 6 is an actuator for rotating the second stage SG2, which is provided on the X slider 2, on a plane (on an XY plane) defined by the two axes (the Y axis and the X axis) that respectively extend along the Y direction and the X direction. Therefore, the second stage SG2 functions as a stage that is rotatable on the XY plane. Also, three Z motors (not shown) are provided that enable movements in the Z direction and rotations around the X axis and the Y axis (enable θx driving and θy driving).

A control unit CU is composed of an information processing apparatus (computer) that includes a CPU, a memory, and the like, and controls the entirety of the positioning apparatus 100 in accordance with a program stored in a storage unit. In the present embodiment, the control unit CU controls the YL actuator 3-1, YR actuator 3-2, X actuator 1-1, and the like. Below is a specific description of control performed by the control unit CU with respect to the YL actuator 3-1, YR actuator 3-2, and X actuator 1-1.

Assume a case where the X slider 2 is moved in the X direction, specifically in the positive direction along the X axis, as indicated by an arrow AR1 on the positioning apparatus 100. Also, assume that a center-of-mass displacement 103 has occurred between the center of mass 101 of an XY moving part including the second stage SG2, and a reaction force 102 from the effort of the X actuator 1-1.

Figure 3A:
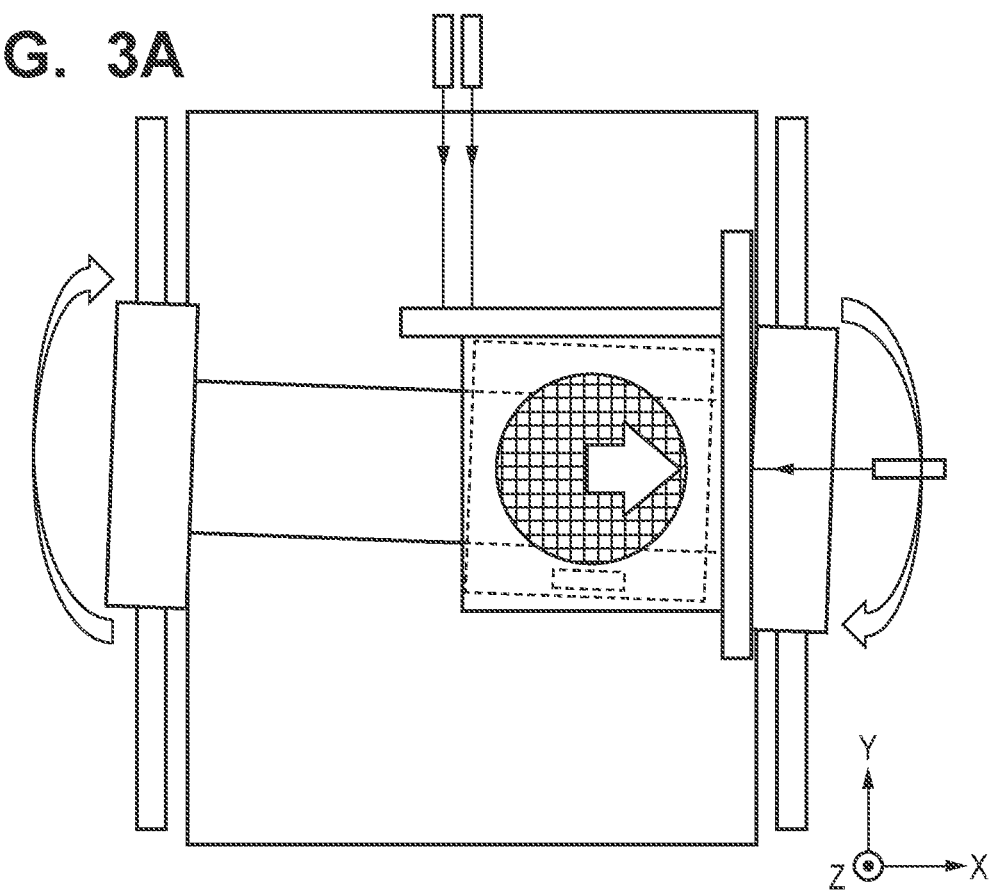
FIG. 3A and FIG. 3B are diagrams for describing a reduction in yawing vibration (rotation) of an X beam according to the present embodiment.

In this case, as a result of moving the X slider 2 in the X axis plus direction, a clockwise moment 104 is generated with respect to the X beam 1 as shown in FIG. 1. Also, due to the moment 104 that has been generated with respect to the X beam 1, the X beam 1 rotates clockwise as shown in FIG. 3A. As the X beam 1 is restrained by Y slider air guides 12 in such a manner that it is supported between movable elements of the YL actuator 3-1 and the YR actuator 3-2 from outside, the foregoing rotation of the X beam 1, or so-called yawing vibration, reverts to a neutral point of the guides with time. However, with the restraint by the Y slider air guides 12, the attenuation rate is low and a long period of time is required until the yawing vibration recedes; thus, the yawing vibration is exerted as a disturbance on X, Y, and θz, thereby influencing the stabilization of the X beam 1.

In the positioning apparatus 100, in order to realize highly accurate positioning, the moment 104 generated by a movement is suppressed as much as possible by making the center of mass 101 of the XY moving part and the effort (reaction force 102) of the X actuator 1-1 coincide with each other. However, due to a weight reduction, restrictions on arrangement, manufacturing tolerance, and the like, it is not possible to make the center of mass 101 of the XY moving part coincide with the effort (reaction force 102) of the X actuator 1-1 in a strict sense. Therefore, a movement in the X direction triggers the yawing vibration of the X beam 1 to some extent.

Figure 3B:
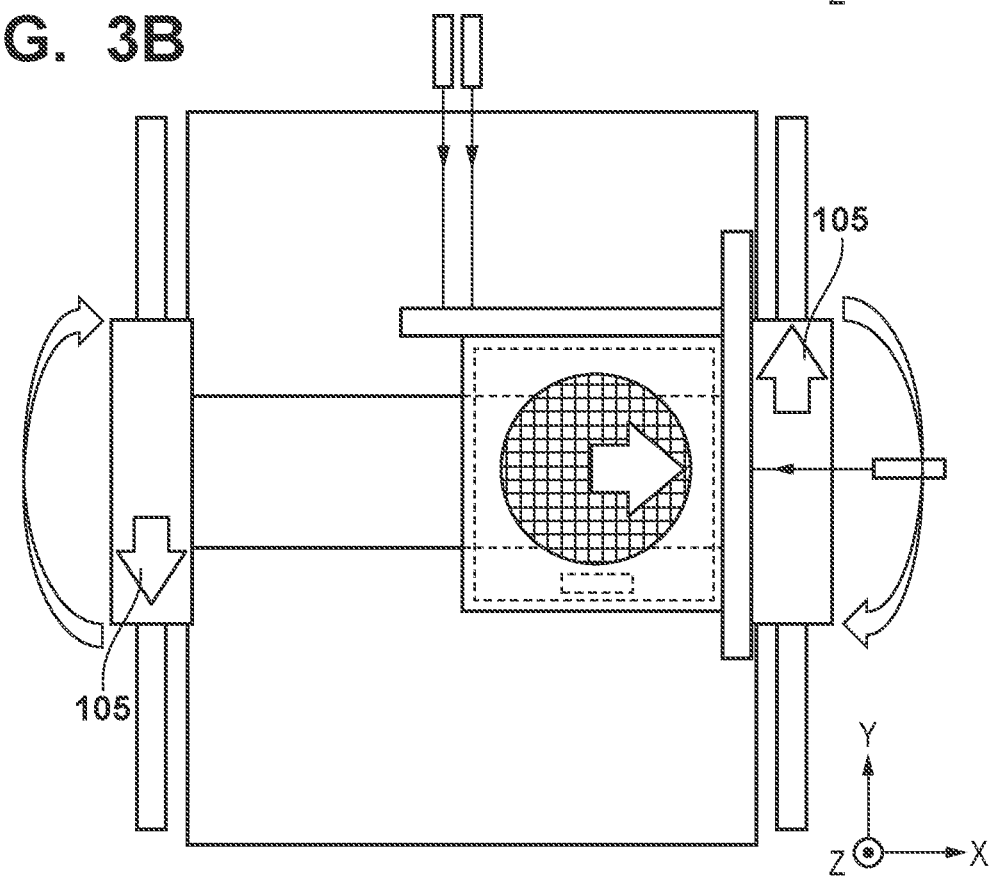

For this reason, in the present embodiment, in order to reduce the yawing vibration of the X beam 1, correction operation amounts 105 are applied to the YL actuator 3-1 and the YR actuator 3-2 so as to offset the moment 104 generated by a movement in the X direction as shown in FIG. 3B. Specifically, different correction operation amounts 105 are applied respectively to the YL actuator 3-1 and the YR actuator 3-2 so that a moment of a direction opposite to the rotary direction of the moment 104 is generated. This can suppress the rotation (yawing vibration) of the X beam 1 caused by the moment 104 that is generated by a movement in the X direction.

The moment 104 is generated by the reaction force of the X actuator 1-1. In FIG. 1, as the center-of-mass displacement 103 has occurred in the positive direction along the Y axis, when the X slider 2 is moved in the positive direction along the X axis, the moment 104 exerted on the X beam 1 acts in the clockwise direction. Therefore, by generating a force in the counterclockwise direction in the YL actuator 3-1 and the YR actuator 3-2, the moment 104 exerted on the X beam 1 can be offset. Specifically, the moment 104 is offset by applying a force to the YL actuator 3-1 in the negative direction, and applying a force to the YR actuator 3-2 in the positive direction, with respect to Y coordinates.

On the other hand, when the X slider 2 is moved in the negative direction along the X axis, the moment exerted on the X beam 1 acts in the counterclockwise direction. Therefore, the counterclockwise moment exerted on the X beam 1 can be offset by generating a force in the clockwise direction in the YL actuator 3-1 and the YR actuator 3-2. Specifically, the moment 104 is offset by applying a force to the YL actuator 3-1 in the positive direction, and applying a force to the YR actuator 3-2 in the negative direction, with respect to Y coordinates.

The moment 104 of the X beam 1 bears a proportional relationship with a force in the X direction. Therefore, the yawing vibration of the X beam 1 can be reduced by applying the correction operation amounts 105, to which a gain of a proportionality constant has been applied, respectively to the YL actuator 3-1 and the YR actuator 3-2 in connection with a force in the X direction with use of the aforementioned signs.

Figure 4:
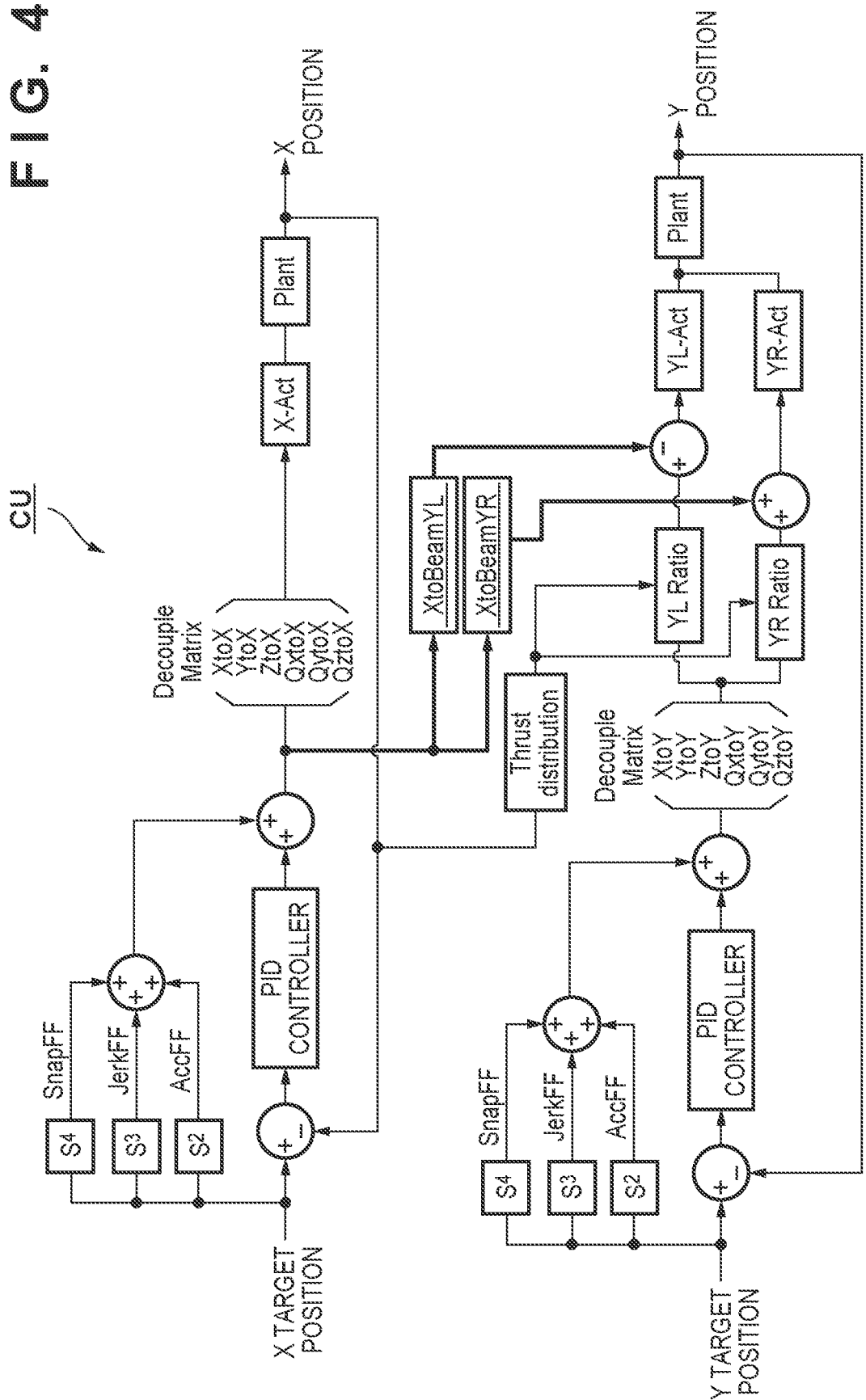
FIG. 4 is a diagram for describing control on each actuator according to the present embodiment.

FIG. 4 is a diagram for describing control that is performed by the control unit CU with respect to the YL actuator 3-1, YR actuator 3-2, and X actuator 1-1. In FIG. 4, blocks represent control blocks related to the X axis (X actuator 1-1), and lower blocks represent control blocks related to the Y axis (YL actuator 3-1 and YR actuator 3-2). In FIG. 4, control that is characteristic to the present embodiment, specifically, control that suppresses the yawing vibration of the X beam 1 with use of an X operation amount is control paths of XtoBeamYL and XtoBeamYR.

The X operation amount serves as the input to XtoBeamYL and XtoBeamYR. The X operation amount is an X operation amount that is obtained as the value of the sum of: the value of the sum of a feedforward control set (AccFF, JerkFF, SnapPP) of values obtained by temporally differentiating a target value in the X direction (an X target position) multiple times; and the output of a PID controller. The input to the control paths of XtoBeamYL and XtoBeamYR is extracted in a stage preceding Decouple Matrix in order to extract only a force necessary for a movement in the X direction (driving along the X axis). For example, if the operation amount is extracted from a stage after Decouple Matrix, the X operation amount includes not only a force for a movement related to XtoX, but also suppression forces that interfere with other axes, such as YtoX, ZtoX, QxtoX, QytoX, and QztoX.

In the present embodiment, the result of multiplying the X operation amount by a gain and a distribution rate of XtoBeamYL and XtoBeamYR is obtained, the sign of the result is reversed, and the result with the reversed sign is used as the correction operation amounts to be applied (as addition or subtraction) respectively to the YL actuator 3-1 and the YR actuator 3-2. These correction operation amounts (outputs) are added to a later stage, in which thrust distribution is performed with respect to each of the YL actuator 3-1 and the YR actuator 3-2, in accordance with the X position. When the center-of-mass displacement 103 has occurred in the positive direction along the Y axis with respect to the effort of the X actuator 1-1, a movement of the X slider 2 in the positive direction along the X axis causes the moment 104 exerted on the X beam 1 to act in the clockwise direction as stated earlier. Therefore, in order to suppress the rotation of the X beam 1, it is sufficient to generate a force in the counterclockwise direction, and thus a negative sign is given to the correction operation amount to be applied to the YL actuator 3-1, and a positive sign is given to the correction operation amount to be applied to the YR actuator 3-2. On the other hand, when the center-of-mass displacement 103 has occurred in the negative direction along the Y axis with respect to the effort of the X actuator 1-1, although it is necessary to reverse the signs of the correction operation amounts to be input, optimal control can be performed by making the gain of XtoBeamYL and XtoBeamYR negative and performing the input. The gain of XtoBeamYL and XtoBeamYR indicates a proportionality constant of the center-of-mass displacement 103. Appropriately setting the value of this proportionality constant makes it possible to output, to the YL actuator 3-1 and the YR actuator 3-2, forces (correction operation amounts) for offsetting the moment 104 that is generated in the X beam 1 with respect to a force that is generated during a movement in the X direction.

As described above, in the present embodiment, the control unit CU obtains, from a first operation amount which is an X operation amount, different first correction operation amounts to be applied respectively to the YL actuator 3-1 and the YR actuator 3-2 in order to reduce the rotation that occurs in the X beam 1. Note that the first operation amount is a first operation amount that is applied to the X actuator 1-1 in order to move the X slider 2 to a first target position in the X direction. Then, the control unit CU applies the different first correction operation amounts respectively to the YR actuator 3-2 and the YL actuator 3-1. At this time, as the control unit CU applies the first operation amount to the X actuator 1-1, feedforward control is performed with respect to the YR actuator 3-2 and the YL actuator 3-1.

In the present embodiment, the positioning apparatus 100 does not require a measurement unit that measures the rotation (yawing vibration) of the X beam 1. However, it is permissible to provide a measurement unit that measures the rotation of the X beam 1, together with the control paths of XtoBeamYL and XtoBeamYR, and perform feedback control with respect to the YL actuator 3-1 and the YR actuator 3-2 based on the result of the measurement performed by this measurement unit. For example, based on the rotation of the X beam 1 that has been measured by the measurement unit after applying the first operation amount (X operation amount) to the X actuator 1-1, different second correction operation amounts, which are to be applied respectively to the YR actuator 3-2 and the YL actuator 3-1 in order to reduce this rotation, are obtained. Then, feedback control is performed with respect to the YL actuator 3-1 and the YR actuator 3-2 by applying the different second correction operation amounts respectively to the YL actuator 3-1 and the YR actuator 3-2. This can accelerate the response of suppression of the yawing vibration of the X beam 1, thereby achieving increased effects compared to simple feedback control.

Also, although the present embodiment has been described in relation to a case where the correction operation amounts to be applied respectively to the YL actuator 3-1 and the YR actuator 3-2 are obtained from the X operation amount, inter-axis interference occurs not only with respect to X, but also with respect to Y and θz. For example, when a center-of-mass displacement has occurred in the X direction, the rotation (yawing vibration) of the X beam 1 can be suppressed by obtaining the correction operation amounts to be applied respectively to the YL actuator 3-1 and the YR actuator 3-2 from a Y operation amount. Also, in a case where the second stage SG2 is rotated around the Z axis (θz), the center of mass of the XY moving part and the effort of the X actuator 1-1 always differ from each other, and thus the X beam 1 is subject to a consequent reaction force. In this case, the rotation (yawing vibration) of the X beam 1 can be suppressed by obtaining the correction operation amounts to be applied respectively to the YL actuator 3-1 and the YR actuator 3-2 from a θz operation amount.

Furthermore, referring to FIG. 4, Decouple Matrix is inter-axis decoupling control disclosed in Patent Literature 2. When the control paths of XtoBeamYL and XtoBeamYR are applied, excessive correction is caused by decoupling control (not shown) for Z, tilting, and rotation of the second stage SG2 in combination with X and Y of the first stage SG1. Therefore, more increased effects are achieved by readjusting respective parameters (XtoX, YtoX, ZtoX, QxtoX, QytoX, and QztoX) of Decouple Matrix. Note that in the illustration of FIG. 4, inputting of respective parameters of Decouple Matrix is omitted.

Figure 5:
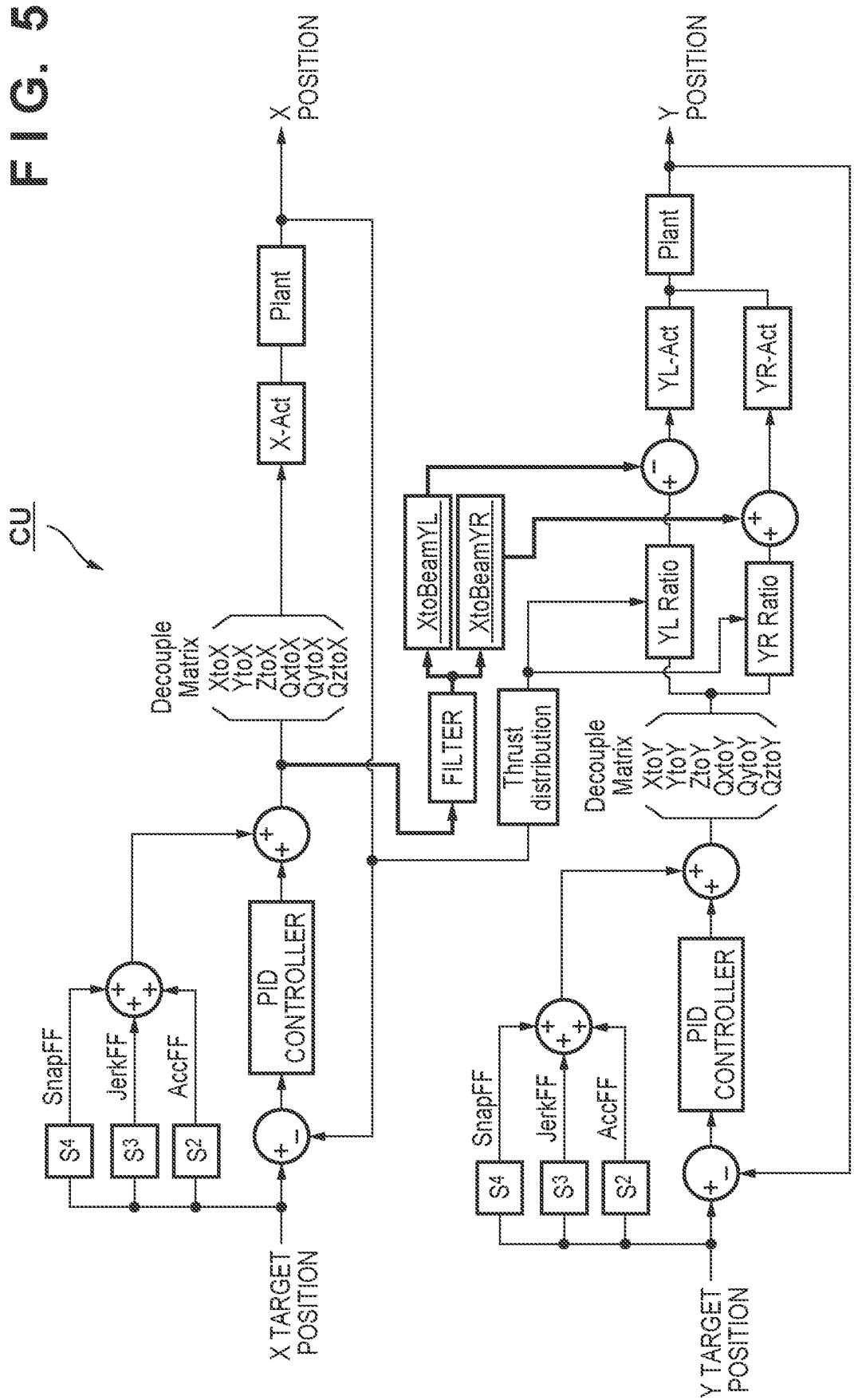
FIG. 5 is a diagram for describing control on each actuator according to the present embodiment.

Furthermore, as shown in FIG. 5, a filter may be added to the control paths of XtoBeamYL and XtoBeamYR. This filter is a band-pass filter that extracts and outputs only a specific frequency corresponding to a principle component of the rotation (yawing vibration) of the X beam 1 that is currently moving in the X direction. However, depending on a positioning apparatus, a high-pass filter that cuts off only DC components, or a low-pass filter that cuts off only AC components, may be added to the control paths of XtoBeamYL and XtoBeamYR. These filters can reduce the influence of noise and increase the gain, thereby improving the vibration suppression effects with respect to a specific frequency.

Figure 6:
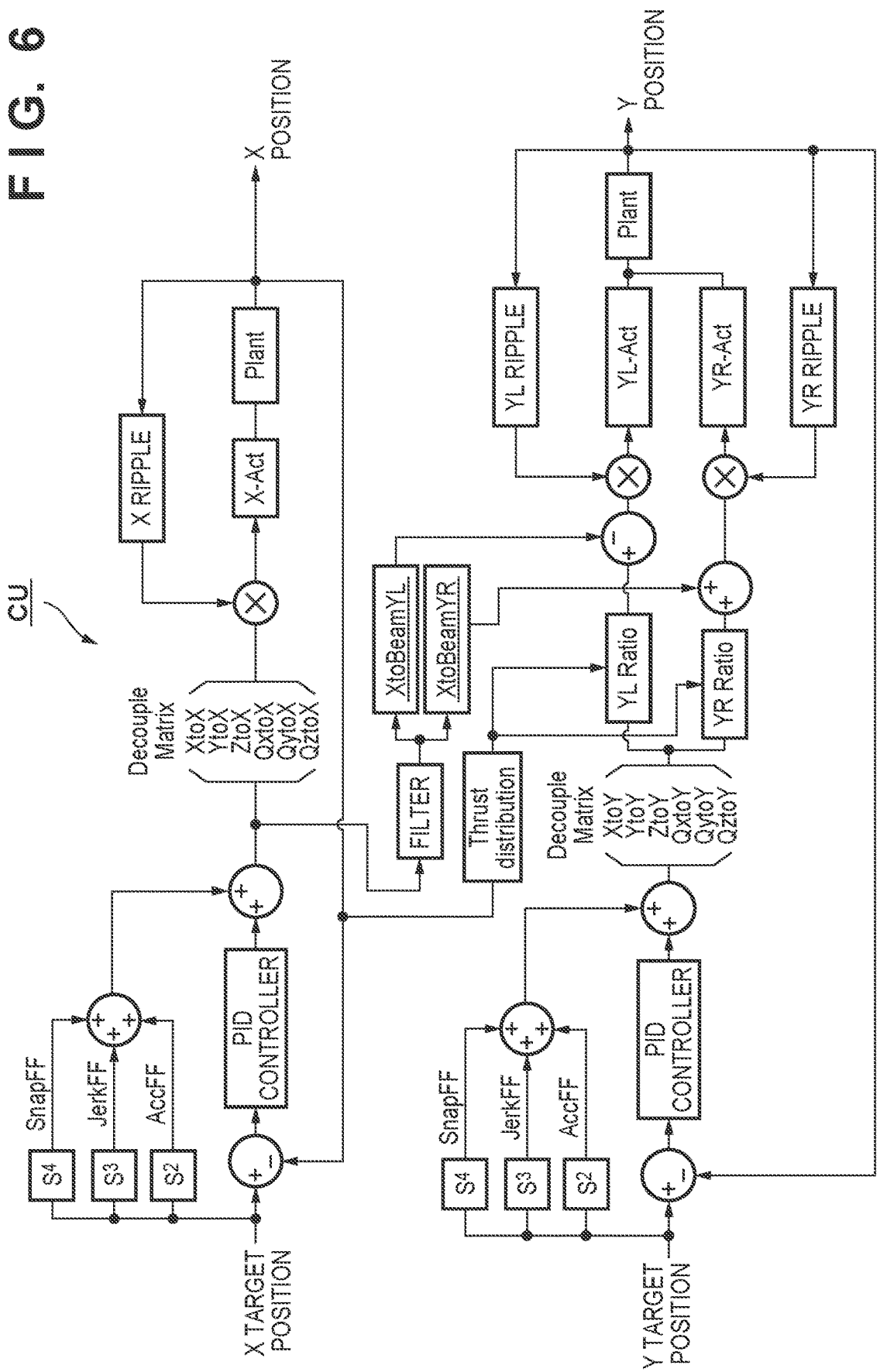
FIG. 6 is a diagram for describing control on each actuator according to the present embodiment.

Furthermore, as shown in FIG. 6, it is permissible to add YL ripple, YR ripple, and X ripple to the constituents (control blocks) of the control unit CU shown in FIG. 5, as thrust correction tables for correcting unevenness in the thrusts of respective actuators. In the present embodiment, as stated earlier, there is no need to perform feedback control with respect to the YL actuator 3-1 and the YR actuator 3-2 by measuring the rotation of the X beam 1; open control, in which the rotation of the X beam 1 is not measured, may be performed. However, when the rotation of the X beam 1 is not measured, it is preferable that the forces of the YL actuator 3-1 and the YR actuator 3-2 are balanced.

In linear motors that are commonly used as a typical example of actuators, depending on the position of a movable element relative to a stationary element, unevenness in the thrust (thrust fluctuation) that corresponds to the pitch of magnets and coils occurs periodically due to variations in the magnetic flux of the magnets and coils. In view of this, as shown in FIG. 6, unevenness in the thrust that occurs depending on the position in the X direction is corrected with use of X ripple. Also, unevenness in the thrust that occurs depending on the position in the Y direction is corrected with use of YL ripple and YR ripple. These kinds of ripple are table parameters of unevenness in the thrust relative to a position, and correction values are changed depending on a position. Thus, the actual forces of actuators corresponding to an operation amount can be uniformly applied in the X direction at an arbitrary position, which makes it possible to control the YL actuator 3-1 and the YR actuator 3-2 as the thrusts that are exactly equal to each other. As a result, suppression of the yawing vibration of the X beam 1 corresponding to an operation amount of a movement in the X direction exerts the effects stably, even in the open control in which the rotation of the X beam 1 is not measured.

On the other hand, when the aforementioned correction that uses each ripple is not performed, thrust variations occur in each actuator depending on a position. For example, in the X actuator 1-1, a moment (force) that is generated with respect to an X operation amount varies. Also, in the YL actuator 3-1 and the YR actuator 3-2, the balance between the thrusts of the YL actuator 3-1 and the YR actuator 3-2 varies depending on a position. Therefore, correction of unevenness in the thrust of each actuator contributes to stability of the effects of suppression of the yawing vibration of the X beam 1.

Figure 7A:
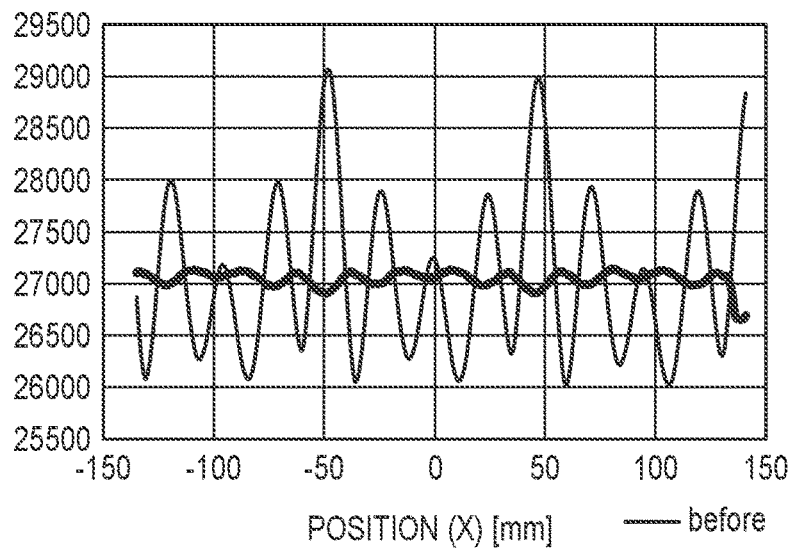
FIG. 7A, FIG. 7B, and FIG. 7C are diagrams showing examples of thrust correction tables.
Figure 7B:
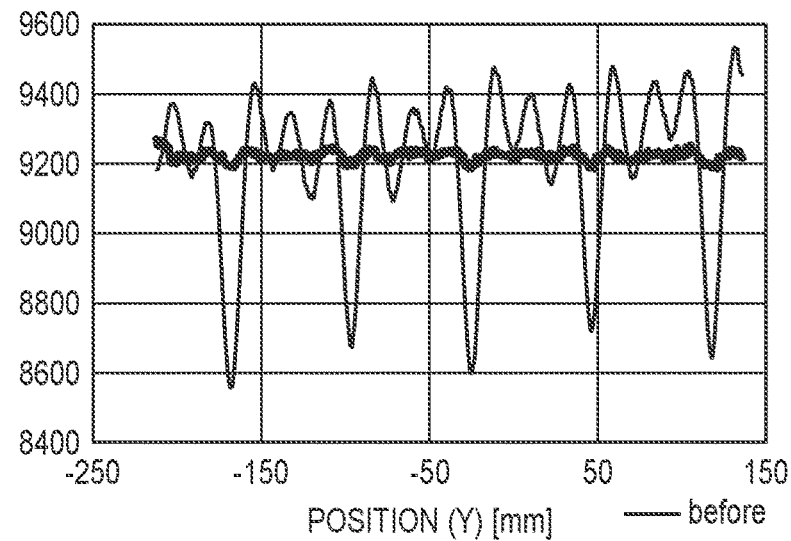
Figure 7C:
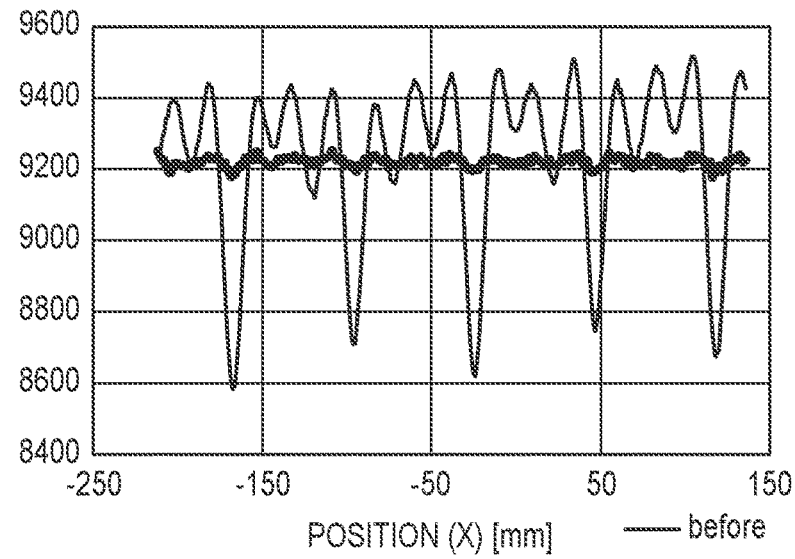

A description is now given of the method of obtaining such thrust correction tables as YL ripple, YR ripple, and X ripple. The thrust of a linear motor is proportional to a counter-electromotive force. Therefore, when a thrust correction table is to be obtained, it is common to obtain a counter-electromotive force that is generated during a movement of a constant acceleration, or a thrust correction table. However, when the counter-electromotive force cannot be measured, it can be replaced with a control amount of feedback control. For example, an operation amount of a constant acceleration period (or a constant deceleration period) during a movement of an arbitrary constant acceleration is extracted. In FIG. 6, this operation amount is equivalent to the value of the sum of: the value of the sum of FF gains, and the output of a PID controller. By performing such extraction of the operation amount while minutely changing a position, the graphs of the operation amount shown in FIG. 7A to FIG. 7C are obtained, and the thrust correction tables corresponding to each position can be generated. In FIG. 7A to FIG. 7C, a horizontal axis indicates a position on each axis to be controlled, and a vertical axis indicates an operation amount corresponding to an arbitrary acceleration. Specifically, it is the average of the absolute values of operation amounts of the same acceleration and deceleration at the same position. By using the average of acceleration and deceleration, the influence of a direction difference, such as a reaction force related to implementation, can be reduced. Referring to FIG. 7A to FIG. 7C, a thin line represents operation amounts before correction (before), and a thick line represents operation amounts after correction; using the values indicated by the thin line as a table, the gains corresponding to the rates of the values of the table are applied to the operation amounts, by way of multiplication, in accordance with the amplitude (magnitude) of the table. When the rates are accurate or when unevenness in the thrust is replicated accurately, the operation amounts after correction represent a constant value as indicated by the thick line. By adjusting the table so as to reduce the amplitude of the operation amounts after correction, the actual thrust of an actuator is output accurately with respect to an operation amount.

FIG. 7A depicts a thrust correction table for the X axis (X actuator 1-1). With regard to the X axis, as it is controlled by one actuator, namely the X actuator 1-1, it is sufficient to simply obtain an operation amount that is used to control the X axis. On the other hand, with regard to the Y axis, it is controlled by two actuators, namely the YL actuator 3-1 and the YR actuator 3-2. Therefore, simply obtaining an operation amount that is used to control the Y axis will generate the same thrust correction table with respect to the YL actuator 3-1 and the YR actuator 3-2, which derives a sum total. As the YL actuator 3-1 and the YR actuator 3-2 are different actuators, it is necessary to generate different tables as thrust correction tables.

To this end, in the present embodiment, different types of unevenness in the thrust are obtained with respect to the YL actuator 3-1 and the YR actuator 3-2. Specifically, the operation amounts before correction that are equivalent to the thin line shown in FIG. 7B are obtained by controlling the Y axis with use of the YL actuator 3-1 alone and extracting the operation amounts in a constant acceleration period during a movement of an arbitrary acceleration. Similarly, the operation amounts before correction that are equivalent to the thin line shown in FIG. 7C are obtained by controlling the Y axis with use of the YR actuator 3-2 alone and extracting the operation amounts in a constant acceleration period during a movement of an arbitrary acceleration. As a result, different thrust correction tables can be generated respectively for the YL actuator 3-1 and the YR actuator 3-2. With regard to control on the Y axis, as it is necessary to balance the thrusts of the YL actuator 3-1 and the YR actuator 3-2, the thrust correction tables are adjusted so as to yield the same operation amounts as the operation amounts after correction indicated by the thick line. In this way, the balance between the thrusts of the YL actuator 3-1 and the YR actuator 3-2 is secured with regard to control on the Y axis.

As described above, even when the counter-electromotive force cannot be measured, the thrust correction table can be generated from the operation amounts along each axis.

By changing correction values in accordance with a position based on such thrust correction tables, for example, the balance between the thrusts of the YL actuator 3-1 and the YR actuator 3-2 is maintained. Therefore, even in the open control in which the rotation of the X beam 1 is not measured, suppression of the yawing vibration of the X beam 1 becomes stable, and increased effects can be achieved. As a result, the measurement unit for measuring the rotation of the X beam 1 becomes unnecessary, and suppression of the yawing vibration of the X beam 1 can be realized at a lower cost.

Next, a description is given of the method of obtaining the parameters of XtoBeamYL and XtoBeamYR (control parameters). When the rotation of the X beam 1 can be measured, it is sufficient to decide on the parameters of XtoBeamYL and XtoBeamYR so that the rotation of the X beam 1 during a movement in the X direction decreases while measuring this rotation. However, when the rotation of the X beam 1 cannot be measured, the parameters of XtoBeamYL and XtoBeamYR cannot be decided on with use of the foregoing method.

Figure 8A:
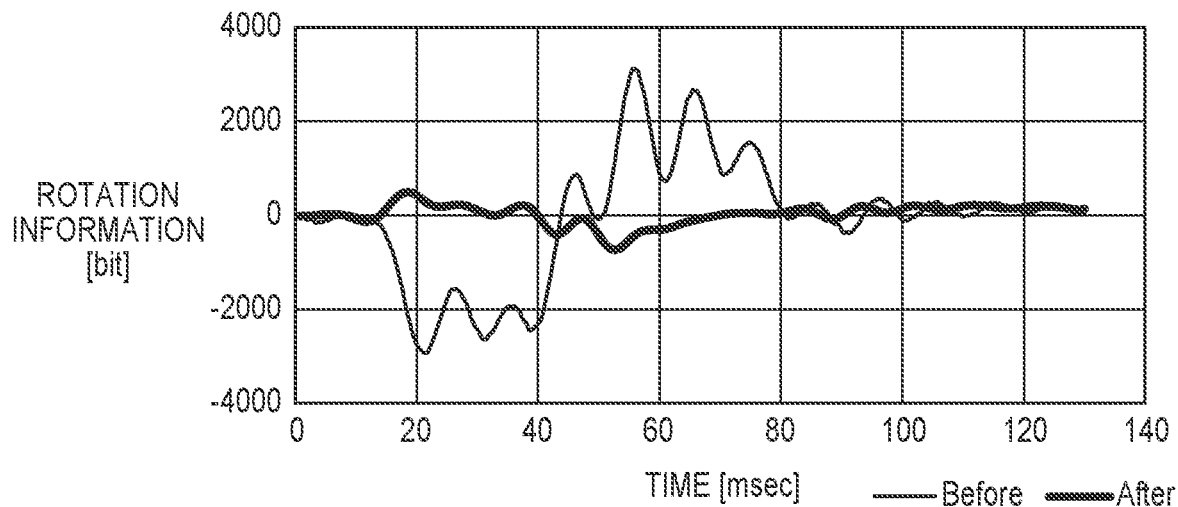
FIG. 8A, FIG. 8B, and FIG. 8C are diagrams showing examples of rotation information of the X beam.
Figure 8B:
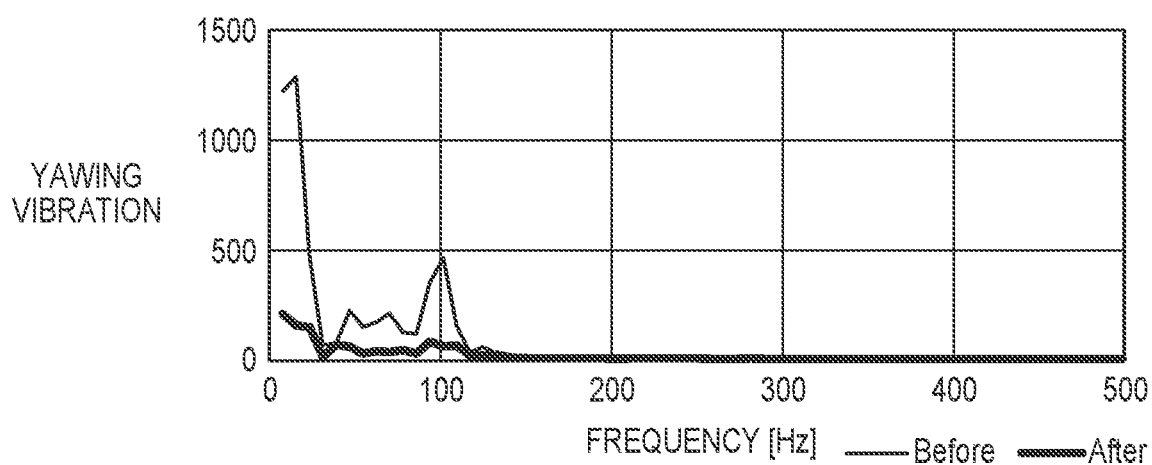
Figure 8C:
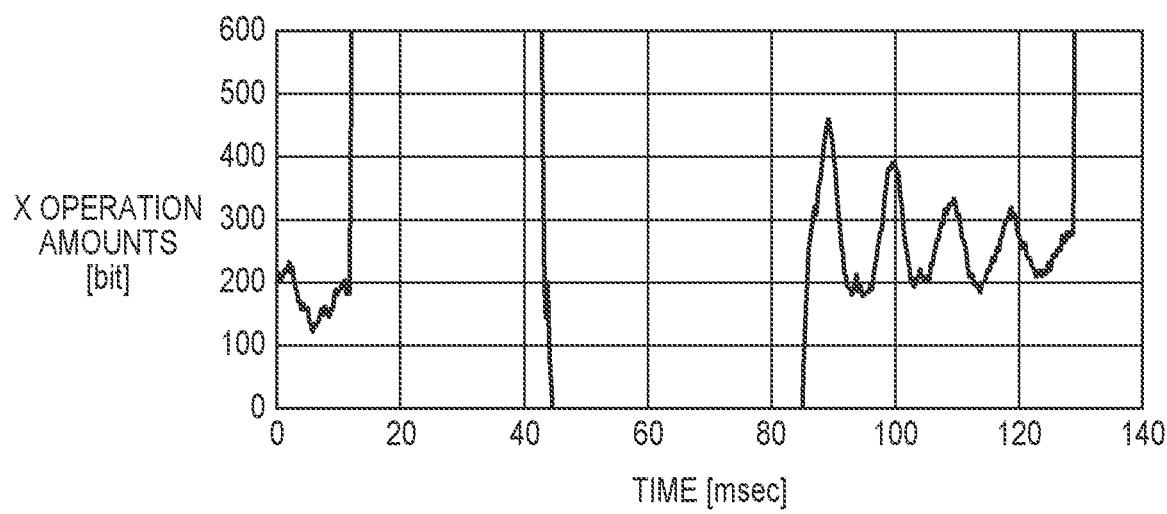

In view of this, in the present embodiment, first, driving of the radial air guide 4 is stopped, the second stage SG2 is caused to be seated on the first stage SG1, and then servo control on the second stage SG2 relative to Z, θx, θy, and θz is stopped (turned OFF). This places the second stage SG2 in a state where it is restrained by the first stage SG1; consequently, information (rotation information) related to the rotation θz of the second stage SG2 matches information (rotation information) related to the rotation of the X beam 1. Rotation information shown in FIG. 8A is obtained by causing a movement in the X direction and obtaining the rotation information related to the rotation θz of the second stage SG2 in a constant cycle in the foregoing state. FIG. 8A shows rotation information of the X beam 1 during a movement in the X direction, with a horizontal axis indicating time, and a vertical axis indicating the rotation information. In FIG. 8A, a thin line represents rotation information before the yawing vibration of the X beam 1 is reduced according to the present embodiment (before), and a thick line represents rotation information after the yawing vibration of the X beam 1 is reduced according to the present embodiment (after). As a result of applying Fourier transform to the rotation information shown in FIG. 8A, FIG. 8B is obtained in which a horizontal axis represents frequencies. In FIG. 8B, a thin line represents rotation information before the yawing vibration of the X beam 1 is reduced according to the present embodiment (before), and a thick line represents rotation information after the yawing vibration of the X beam 1 is reduced according to the present embodiment (after). Referring to FIG. 8B, it is apparent that, before the yawing vibration of the X beam 1 is reduced, there is yawing vibration with low attenuation in the vicinity of a frequency of 100 Hz. X operation amounts at this time are shown in FIG. 8C. The X operation amounts shown in FIG. 8C include the influence of the yawing vibration of the X beam 1. The yawing vibration during stabilization of the X beam 1 can be suppressed by adding such X operation amounts to the operation amounts of the YL actuator 3-1 and the YR actuator 3-2 via a band-pass filter centered at 100 Hz corresponding to low attenuation. Then, the optimal gains are obtained by checking the X beam 1 while changing the gains and rates so as to achieve XtoBeamYL and XtoBeamYR with the greatest attenuation effects (trial and error). As a result of setting the optimal band-pass filter and parameters in the foregoing manner, the amplitude of the yawing vibration of the X beam 1 can be reduced, and the attenuation thereof can be accelerated.

Note that according to the foregoing method, as the second stage SG2, which is actually in a contactless state, is brought into contact with the first stage SG1, a movement of high acceleration is not possible. Therefore, it is sufficient to use the foregoing method in specification of the frequency of the yawing vibration of the X beam 1 and in rough adjustment, and then perform precisive adjustment.

Specifically, in a state where all axes are under servo control, XtoBeamYL and YtoBeamYR are adjusted so as to minimize the control deviation in the Y direction after a movement in the X direction with use of a profile that is the same as the actual operations (e.g., at the time of exposure to light). With this adjustment, in a state where there is a maximum distance between the X coordinate at which the Y bar mirror 9-2 is irradiated with light (optical axis) from the Y laser interferometer 9-1 and the X coordinate of the center of the rotation (θz) of the X beam 1), the yawing vibration of the X beam 1 brings about the maximum disturbance with respect to the Y axis. Therefore, it is effective to perform the foregoing adjustment at an outer position relative to the X axis.

Also, the deviation during exposure to light at the time of the execution of the actual operations, for example, the operations that are the same as the operations during exposure to light, may be adjusted as an evaluation value. There are two indexes for the control deviation in the Y direction: an absolute value, and variations in the deviation at different positions in the X direction. The absolute value can be reduced by adjusting the gains while using the average value of the control deviations at all exposure coordinates in the Y direction as an evaluation index. On the other hand, the variations can be suppressed by adjusting the gains while using the standard deviation of the control deviations at all exposure coordinates in the Y direction as an evaluation index. In order to reduce the absolute value, it is effective to lower the frequency of the band-pass filter. On the other hand, in order to suppress the standard deviation, it is necessary to raise the frequency of the band-pass filter and increase the gains. As described above, there is a trade-off relationship between the average value and the standard deviation. When the balance is taken into consideration, it is sufficient to perform the adjustment by using the sum of the average value and the standard deviation as an evaluation value. The optimal state of adjustment varies depending on the performance required for a positioning apparatus, and the adjustment needs to be performed by selecting an evaluation value in view of the same.

Although the present embodiment has been described using an H-shaped stage apparatus as the positioning apparatus 100 by way of example, no limitation is intended by this. For example, a method similar to the present embodiment can be applied also to a stage apparatus with a structure in which a plurality of structural elements provided with freedom in the θ direction are configured, similarly to the X beam 1 and the second stage SG2 according to the positioning apparatus 100.

For example, assume a case where the second stage SG2 is rotated to reach a target rotation position on the XY plane. In this case, in order to reduce the rotation that occurs in the X beam 1, different correction operation amounts that are to be applied respectively to the YL actuator 3-1 and the YR actuator 3-2 are obtained from an operation amount applied to the θz motor 6. Then, feedforward control is performed with respect to the YL actuator 3-1 and the YR actuator 3-2 by applying the operation amount to the θz motor 6 and applying the obtained different correction operation amounts respectively to the YL actuator 3-1 and the YR actuator 3-2.

Also, the application is possible also in a case where the X slider 2 is moved to a second target position in the Y direction. In this case, in order to reduce the rotation that occurs in the X beam 1, different correction operation amounts that are to be applied respectively to the YL actuator 3-1 and the YR actuator 3-2 are obtained from the operation amounts applied to the YL actuator 3-1 and the YR actuator 3-2. Then, feedforward control is performed with respect to the YL actuator 3-1 and the YR actuator 3-2 by applying the obtained different correction operation amounts respectively to the YL actuator 3-1 and the YR actuator 3-2, together with the operation amount for the movement to the second target position.

Furthermore, the present embodiment can be applied also to a positioning apparatus that includes a first actuator which causes a beam to move in a first direction, and a second actuator which is built in the beam and which causes an object to move, relative to the beam, in a second direction that intersects with the first direction. In this case, in order to reduce a displacement that occurs in the beam in a direction other than the second direction, a correction operation amount to be applied to the first actuator is obtained from an operation amount that is applied to the second actuator so as to move the object to a first target position in the second direction. The feature lies in that feedforward control is performed with respect to the first actuator by applying the operation amount for the movement to the first target position to the second actuator, and also by applying the obtained correction operation amount to the first actuator.

Figure 9:
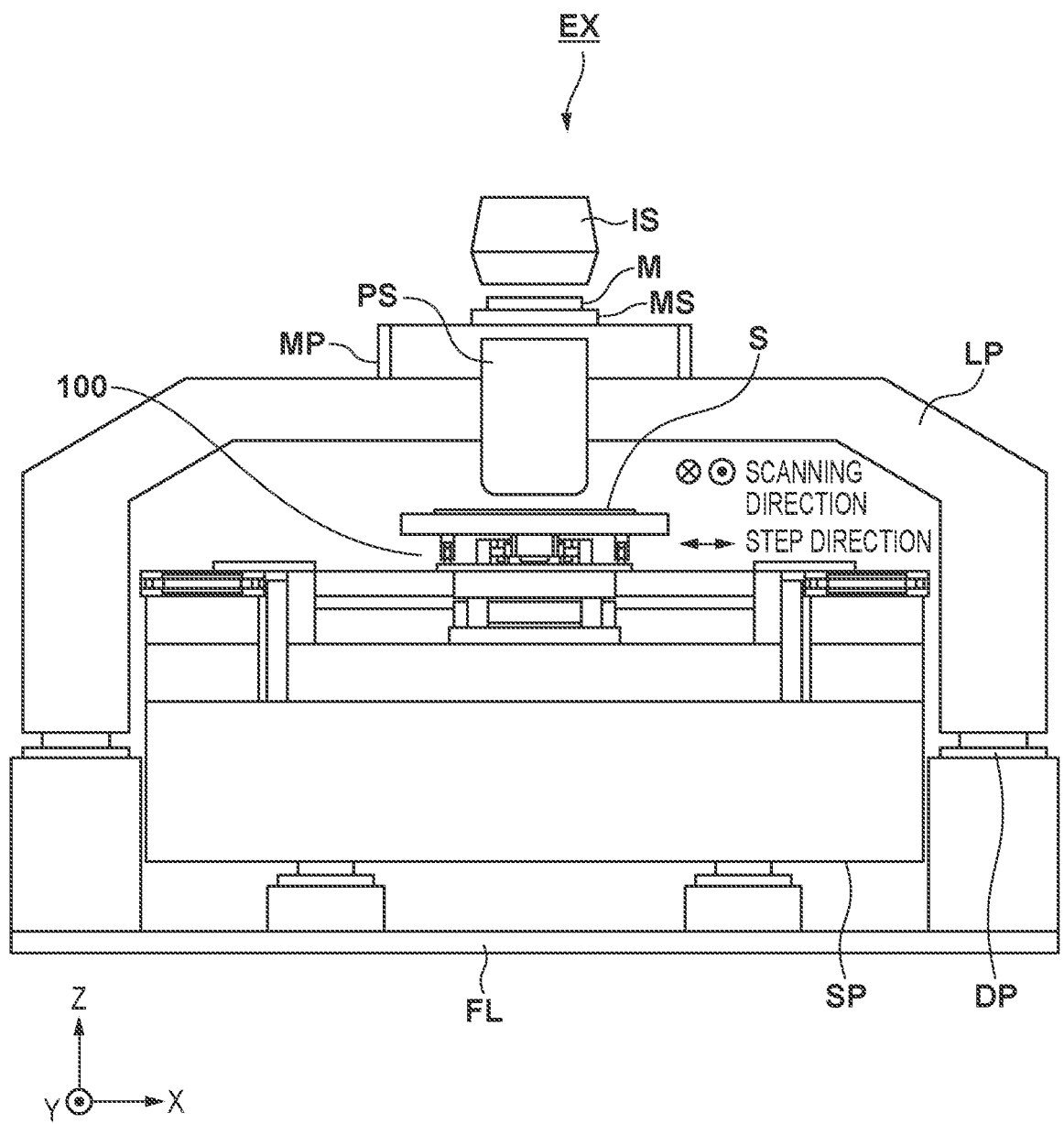
FIG. 9 is a schematic diagram showing a configuration of an exposure apparatus as one aspect of the present invention.

FIG. 9 is a schematic diagram showing a configuration of an exposure apparatus EX as one aspect of the present invention. The exposure apparatus EX is, for example, a lithography apparatus that is used in a lithography process, which is a manufacturing process for such devices as semiconductor elements and liquid crystal display elements, and forms a pattern on a substrate with use of an original plate. The exposure apparatus EX performs exposure processing in which the pattern of a mask M (reticle), which is an original plate, is transferred to a substrate S by exposing the substrate S to light via the mask M. In the present embodiment, the exposure apparatus EX uses a step-and-scan method. However, the exposure apparatus EX can also use a step-and-repeat method or other exposure methods. Note that FIG. 9 indicates directions based on an XYZ coordinate system in which a plane parallel to the surface of the substrate S is the XY plane.

As shown in FIG. 9, the exposure apparatus EX includes a stage surface plate SP, a positioning apparatus 100, a lens barrel surface plate LP, dampers DP, a projection optical system PS, an illumination optical system IS, a mask surface plate MP, and a mask stage MS.

The stage surface plate SP is supported by a floor FL via a mount (not shown). The positioning apparatus 100 is provided on the stage surface plate SP. The lens barrel surface plate LP is supported by the floor FL via the dampers DP. The lens barrel surface plate LP is provided with the projection optical system PS and the mask surface plate MP. The mask stage MS is movably (slidably) provided on the mask surface plate MP. The illumination optical system IS is provided above the mask stage MS.

During exposure, light emitted from a light source (not shown) illuminates the mask M via the illumination optical system IS. The pattern of the mask M is projected (formed) by the projection optical system PS onto the substrate S. At this time, the mask stage MS and the positioning apparatus 100 respectively scan the mask M and the substrate S in the scanning direction in a relative fashion. As stated earlier, the positioning apparatus 100 used by the exposure apparatus EX can realize highly accurate positioning. Therefore, the exposure apparatus EX can provide high-quality devices (such devices as semiconductor elements, magnetic storage mediums, and liquid crystal display elements) with high throughput and high economic efficiency.

An article manufacturing method according to the embodiment of the present invention is favorable in, for example, manufacturing such articles as devices (e.g., semiconductor elements, magnetic storage mediums, and liquid crystal display elements). This manufacturing method includes a process of forming a pattern on a substrate, a process of processing the substrate on which the pattern has been formed, and a process of manufacturing an article from the processed substrate, with use of the exposure apparatus EX. Also, this manufacturing method can include other known processes (oxidization, film formation, vapor deposition, doping, planarization, etching, photoresist stripping, dicing, bonding, packaging, and so forth). Compared to the conventional ones, the article manufacturing method according to the present embodiment is advantageous in at least one of the performance, quality, productivity, and production cost of an article.

Note that in the present invention, the lithography apparatus is not limited to the exposure apparatus, and is also applicable to, for example, an imprint apparatus. The imprint apparatus brings an imprint material supplied (arranged) on a substrate and a mold (original plate) into contact with each other, and applies energy for hardening to the imprint material, thereby transferring the pattern of the mold and forming a hardened material with the pattern.

Also, in the present embodiment, the positioning apparatus 100 is used as a positioning apparatus for the substrate S in the exposure apparatus EX; however, as long as it is an H-shaped stage apparatus, it can be applied also as any positioning apparatus, such as a positioning apparatus for the mask M, namely the mask stage MS.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-170031 filed on Oct. 7, 2020, which is hereby incorporated by reference herein in its entirety.

What is claimed is:

1. A positioning apparatus for positioning an object, the positioning apparatus comprising:
a first actuator and a second actuator arranged along a first direction so as to be parallel to each other, and configured to move a beam in the first direction;
a third actuator disposed in the beam, and configured to move the object in a second direction relative to the beam, the second direction intersecting with the first direction; and
a control unit configured to control the first actuator, the second actuator, and the third actuator,
wherein the control unit:
obtains, from a first operation amount to be applied to the third actuator so as to move the object to a first target position in the second direction, different first correction operation amounts to be applied respectively to the first actuator and the second actuator so as to reduce rotation that occurs in the beam due to the movement of the object to the first target position;
applies the first operation amount to the third actuator;
applies the different first correction operation amounts respectively to the first actuator and the second actuator;
performs feedforward control with respect to the first actuator and the second actuator;
includes a band-pass filter that extracts a specific frequency corresponding to principle components of the rotation from the first operation amount, and outputs the specific frequency; and
obtains the different first correction operation amount from the output of the band-pass filter.

2. The positioning apparatus according to claim 1, wherein the different first correction operation amounts are operation amounts that cause the object to move in opposite directions along the first direction.

3. The positioning apparatus according to claim 1, further comprising:
a measurement unit configured to measure the rotation of the beam,
wherein the control unit:
obtains, from the rotation that has been measured by the measurement unit after the first operation amount has been applied to the third actuator, different second correction operation amounts to be applied to the first actuator and the second actuator so as to reduce the rotation;
applies the different second correction operation amounts respectively to the first actuator and the second actuator; and
performs feedback control with respect to the first actuator and the second actuator.

4. The positioning apparatus according to claim 1, wherein the control unit:
obtains, from a second operation amount to be applied to each of the first actuator and the second actuator so as to move the object to a second target position in the first direction, different second correction operation amounts to be applied respectively to the first actuator and the second actuator so as to reduce rotation that occurs in the beam due to the movement of the object to the second target position;
applies the different second correction operation amounts respectively to the first actuator and the second actuator together with the second operation amount; and
performs the feedforward control with respect to the first actuator and the second actuator.

5. A positioning apparatus for positioning an object, the positioning apparatus comprising:
a first actuator and a second actuator arranged along a first direction so as to be parallel to each other, and configured to move a beam in the first direction;
a third actuator disposed in the beam, and configured to move the object in a second direction relative to the beam, the second direction intersecting with the first direction;
a fourth actuator configured to rotate a stage, relative to the beam, on a plane defined by two axes that extend respectively along the first direction and the second direction, the stage being disposed on a slider arranged on the beam,
a control unit configured to control the first actuator, the second actuator, the third actuator, and the fourth actuator,
wherein the control unit:
obtains, from a first operation amount to be applied to the third actuator so as to move the object to a first target position in the second direction, different first correction operation amounts to be applied respectively to the first actuator and the second actuator so as to reduce rotation that occurs in the beam due to the movement of the object to the first target position;
applies the first operation amount to the third actuator;
applies the different first correction operation amounts respectively to the first actuator and the second actuator;
performs feedforward control with respect to the first actuator and the second actuator;
obtains, from a second operation amount to be applied to the fourth actuator so as to rotate the stage to reach a target rotation position on the plane, different second correction operation amounts to be applied respectively to the first actuator and the second actuator so as to reduce rotation that occurs in the beam due to the movement of the stage to the target rotation position;
applies the second operation amount to the fourth actuator;
applies the different second correction operation amounts respectively to the first actuator and the second actuator; and
performs the feedforward control with respect to the first actuator and the second actuator.

6. A positioning apparatus for positioning an object, the positioning apparatus comprising:

a first actuator and a second actuator arranged along a first direction so as to be parallel to each other, and configured to move a beam in the first direction;

a third actuator disposed in the beam, and configured to move the object in a second direction relative to the beam, the second direction intersecting with the first direction;

a control unit configured to control the first actuator, the second actuator, and the third actuator, wherein the control unit:

obtains, from a first operation amount to be applied to the third actuator so as to move the object to a first target position in the second direction, different first correction operation amounts to be applied respectively to the first actuator and the second actuator so as to reduce rotation that occurs in the beam due to the movement of the object to the first target position;

applies the first operation amount to the third actuator;

applies the different first correction operation amounts respectively to the first actuator and the second actuator;

performs feedforward control with respect to the first actuator and the second actuator;

includes thrust correction tables for correcting fluctuations in thrusts of the first actuator, the second actuator, and the third actuator, respectively; and corrects the fluctuations in the thrusts of the first actuator, the second actuator, and the third actuator, respectively, based on the thrust correction tables during the movement of the object.

7. The positioning apparatus according to claim 6, wherein the thrust correction tables are generated from operation amounts that are applied respectively to the first actuator, the second actuator, and the third actuator.

8. The positioning apparatus according to claim 7, wherein the operation amounts that are applied respectively to the first actuator, the second actuator, and the third actuator include an operation amount during a constant acceleration period and an operation amount during a constant deceleration period, in a state where the object has been moved at a constant acceleration.

9. The positioning apparatus according to claim 8, wherein the thrust correction tables have been adjusted so as to reduce amplitudes of the operation amounts that are applied respectively to the first actuator, the second actuator, and the third actuator.

10. The positioning apparatus according to claim 7, wherein the thrust correction table corresponding to the first actuator is generated from an operation amount that is applied to the first actuator, in a state where the object is moved in the first direction by the first actuator alone.

11. The positioning apparatus according to claim 7, wherein the thrust correction table corresponding to the second actuator is generated from an operation amount that is applied to the second actuator, in a state where the object is moved in the first direction by the second actuator alone.

12. The positioning apparatus according to claim 1, wherein the control unit decides on a gain and a rate for obtaining the different first correction operation amounts based on a result of measurement of the rotation that occurs in the beam due to the movement of the object to the first target position.

13. The positioning apparatus according to claim 12, further comprising:

a stage configured to hold the object, and rotate on a plane defined by two axes that extend respectively along the first direction and the second direction; and a measurement unit configured to measure the rotation of the stage, wherein the control unit decides on the gain and the rate based on a result of measurement obtained by the measurement unit, in a state where the stage is restrained by the beam.

14. The positioning apparatus according to claim 1, wherein the control unit decides on a gain and a rate for obtaining the different first correction operation amounts based on a control deviation of a position of the object in the first direction attributed to the movement of the object to the first target position.

15. The positioning apparatus according to claim 1, wherein the first direction and the second direction are perpendicular to each other.

16. A positioning apparatus for positioning an object, the positioning apparatus comprising:

a first actuator configured to move a beam in a first direction;

a second actuator disposed in the beam, and configured to move the object in a second direction relative to the beam, the second direction intersecting with the first direction; and a control unit configured to control the first actuator and the second actuator, wherein the control unit:

obtains, from an operation amount to be applied to the second actuator so as to move the object to a first target position in the second direction, a correction operation amount to be applied to the first actuator so as to reduce a displacement that occurs in the beam in a direction other than the second direction due to the movement of the object to the first target position;

applies the operation amount to the second actuator;

applies the correction operation amount to the first actuator;

performs feedforward control with respect to the first actuator;

includes a band-pass filter that extracts a specific frequency corresponding to principle components of the rotation from the first operation amount, and outputs the specific frequency; and obtains the correction operation amount from the output of the band-pass filter.

17. A lithography apparatus that forms a pattern on a substrate, the lithography apparatus comprising:

the positioning apparatus according to claim 1, the positioning apparatus positioning using the substrate as the object.

18. A lithography apparatus that forms a pattern on a substrate, the lithography apparatus comprising:

the positioning apparatus according to claim 16, the positioning apparatus positioning using the substrate as the object.

19. A lithography apparatus that forms a pattern on a substrate via an original plate, the lithography apparatus comprising:

the positioning apparatus according to claim 1, the positioning apparatus positioning using the original plate as the object.

20. A lithography apparatus that forms a pattern on a substrate via an original plate, the lithography apparatus comprising:

the positioning apparatus according to claim 16, the positioning apparatus positioning using the original plate as the object.

21. An article manufacturing method comprising:

forming a pattern on a substrate using the lithography apparatus according to claim 17;

processing the substrate on which the pattern has been formed in the forming; and manufacturing an article from the processed substrate.

22. An article manufacturing method comprising:

forming a pattern on a substrate using the lithography apparatus according to claim 18;

processing the substrate on which the pattern has been formed in the forming; and manufacturing an article from the processed substrate.

23. An article manufacturing method comprising:

forming a pattern on a substrate using the lithography apparatus according to claim 19;

processing the substrate on which the pattern has been formed in the forming; and manufacturing an article from the processed substrate.

24. An article manufacturing method comprising:

forming a pattern on a substrate using the lithography apparatus according to claim 20;

processing the substrate on which the pattern has been formed in the forming; and manufacturing an article from the processed substrate.

\* \* \* \* \*